United States Patent
Kasai (10) Patent No.: US 10,197,616 B2
(45) Date of Patent: Feb. 5, 2019

(54) INSULATION INSPECTION METHOD AND INSULATION INSPECTION APPARATUS

(71) Applicant: NIDEC-READ CORPORATION, Kyoto (JP)

(72) Inventor: Jun Kasai, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 324 days.

(21) Appl. No.: 14/777,747

(22) PCT Filed: Mar. 18, 2014

(86) PCT No.: PCT/JP2014/001555
§ 371 (c)(1),
(2) Date: Sep. 17, 2015

(87) PCT Pub. No.: WO2014/148050
PCT Pub. Date: Sep. 25, 2014

(65) Prior Publication Data
US 2016/0178690 A1    Jun. 23, 2016

(30) Foreign Application Priority Data
Mar. 19, 2013    (JP) .................. 2013-055987

(51) Int. Cl.
*G01R 31/12* (2006.01)
*G01R 31/14* (2006.01)
*G01R 31/28* (2006.01)

(52) U.S. Cl.
CPC ......... *G01R 31/1272* (2013.01); *G01R 31/14* (2013.01); *G01R 31/2813* (2013.01); *G01R 31/2853* (2013.01)

(58) Field of Classification Search
CPC ............. G01R 31/1272; G01R 31/14; G01R 31/2813; G01R 31/2853
USPC ..................................... 324/763.01
See application file for complete search history.

(56) References Cited

U.S. PATENT DOCUMENTS

2005/0200363 A1* 9/2005 Hasegawa ......... G01R 31/2805
 324/523
2012/0119755 A1* 5/2012 Ishii .................... G01R 27/025
 324/551

FOREIGN PATENT DOCUMENTS

| JP | H01-170860 A | 7/1989 | |
|---|---|---|---|
| JP | 3546046 B2 | 7/2004 | |
| JP | 2008089485 * | 4/2008 | ............. G01R 31/02 |

(Continued)

OTHER PUBLICATIONS

International Search Report issued in the corresponding PCT International Application No. PCT/JP2014/001555 dated Jun. 24, 2014, 1 page.

*Primary Examiner* — Jeff Natalini
(74) *Attorney, Agent, or Firm* — Viering, Jentschura & Partner mbB (57) ABSTRACT

In an insulation inspection apparatus configured to perform insulation inspection of a wiring pattern, when a voltage for performing the insulation inspection is applied between inspection objects, a current control unit controls a first current to be greater than a second current, the first current being supplied until the potential difference between the first inspection part and the second inspection part reaches the predetermine potential difference, the second current being supplied when the predetermined potential difference is reached.

15 Claims, 3 Drawing Sheets

(56) References Cited

FOREIGN PATENT DOCUMENTS

JP  2008-128678 A  6/2008

* cited by examiner

INSULATION INSPECTION METHOD AND INSULATION INSPECTION APPARATUS

RELATED APPLICATIONS

The present application is a national stage entry according to 35 U.S.C. § 371 of PCT application No.: PCT/JP2014/001555 filed on Mar. 18, 2014, which claims priority from Japanese application No.: 2013-055987 filed on Mar. 19, 2013, and is incorporated herein by reference in its entirety.

TECHNICAL FIELD

Various embodiments relate to an insulation inspection method and an insulation inspection apparatus regarding insulation inspection of wiring patterns on a circuit board or a substrate. Various embodiments may be applied to the inspection of electrical wiring not only on a printed circuit board but also on various circuit boards such as, for example, a flexible substrate, a multilayer wiring board, an electrode plate for a liquid crystal display and a plasma display, a package substrate for a semiconductor package, and a film carrier. In this description, the various wiring boards are collectively referred to as the "circuit board".

BACKGROUND

The wiring patterns formed on the circuit board are conventionally used to transmit and receive electrical signals to an integral circuit (IC) and a semiconductor component mounted on the circuit board, or other electronic components. The wiring patterns as described above are formed to be less resistant as the formation of the wiring patterns becomes more fine and complicated in association with recent miniaturization of the electronic components. As described above, as the miniaturization of the wiring patterns on the circuit board progresses, higher accuracy is required to inspect the quality of the wiring patterns, or whether the wiring patterns are non-defective or defective.

As a method of inspecting the quality of the wiring patterns, there are broadly two types of inspection: conduction inspection for inspecting whether the wiring patterns are formed with a predetermined resistance value, and insulation inspection for inspecting whether each wiring pattern is formed without a short-circuit.

In particular, the insulation inspection is to inspect an insulation state from a resistance value between wiring patterns, which is calculated by applying a voltage to one of the wiring patterns and by measuring a current flowing in the other wiring pattern.

In the insulation inspection as described above, immediately after a predetermined voltage (or applied voltage V) is applied to the one wiring pattern, a voltage between the wiring patterns is unstable and a high transient current instantaneously flows between the wiring patterns. Thus, the voltage between the wiring patterns is stabilized at the applied voltage V. Moreover, the quality of the insulation state is determined after an elapsed time (or a predetermined time) in which the current is stabilized. However, the application of a relatively high direct current voltage (or applied voltage) between the wiring patterns as the inspection objects sometimes causes a spark (or a discharge phenomenon) between the wiring patterns before the predetermined time elapses after the application of the voltage. The spark changes an insulation resistance value between the wiring patterns, and this complicates the calculation of a correct insulation resistance value between the wiring patterns, which is problematic.

In order to improve the problem, for example, a technology disclosed in Japanese Patent No. 3546046 can be used. In the technology disclosed in Japanese Patent No. 3546046, the spark is detected by measuring a variation in voltage between the wiring patterns during the predetermined time in which the applied voltage is applied to the wiring patterns and by detecting a voltage drop when the spark occurs as described above. For example, a graph illustrating a voltage change in FIG. 10 of Japanese Patent No. 3546046 indicates that the spark occurs at a time point t21 and a time point t22 in the graph. As described above, the spark is detected by detecting the voltage change and by detecting the voltage drop caused by the spark (or a value obtained by calculating "dv/dt") (at positions of A and B in the graph).

Since the circuit board as described above is mass-produced, it is important how to efficiently inspect the mass-produced circuit boards and complete the inspection. Therefore, a method of reliably and efficiently performing the insulation inspection is required.

SUMMARY

Various embodiments provide a method of detecting a spark phenomenon (or a spark failure) as described above and efficiently performing the insulation inspection, and an insulation inspection apparatus.

An embodiment according to example 1 provides an insulation inspection apparatus configured to perform insulation inspection of a wiring pattern as an inspection object which is selected from a plurality of wiring patterns formed on a circuit board, the insulation inspection apparatus provided with: a selecting device configured to select as a first inspection part the wiring pattern as the inspection object from the plurality of wiring patterns and to select as a second inspection part a wiring pattern as an inspection object other than the first inspection part; a power supply device electrically connected to each of the first inspection part and the second inspection part and to supply electric power, in order to set a predetermined potential difference between the first inspection part and the second inspection part; a voltage detecting device configured to detect a potential difference between the first inspection part and the second inspection part; and a determining device configured to determine the circuit board to be a non-defective product or a defective product by using a voltage value detected by the voltage detecting device, wherein the power supply device comprises a current control unit configured to control a current from the power supply device, and the current control unit controls a first current to be greater than a second current, the first current being supplied until the potential difference between the first inspection part and the second inspection part reaches the predetermine potential difference, the second current being supplied when the predetermined potential difference is reached.

An embodiment according to example 2 provides the insulation inspection apparatus according to example 1, wherein the current control unit controls the first current and the second current to be in a range of 0 to 30 mA.

An embodiment according to example 3 provides the insulation inspection apparatus according to example 1 or 2, wherein the current control unit controls the first current to be 5 to 30 times the second current.

An embodiment according to example 4 provides an insulation inspection method of performing insulation inspection of a wiring pattern as an inspection object which is selected from a plurality of wiring patterns formed on a circuit board, the insulation inspection method provided with: a process of selecting as a first inspection part the wiring pattern as the inspection object from the plurality of wiring patterns and of selecting as a second inspection part a wiring pattern as an inspection object other than the first inspection part; a process of supplying electric power such that a predetermined potential difference for the insulation inspection between the inspection objects; a process of detecting a potential difference between the inspection objects when the electric power is supplied between the inspection objects; a process of determining an insulation state between the inspection objects on the basis of the detected potential difference; and a process of controlling a current value supplied until the potential difference is reached to be greater than a current value supplied after the potential difference is reached, when the potential difference is set between the inspection objects.

According to the embodiments described in examples 1 and 4, if the predetermined potential difference for performing the insulation inspection is applied between the inspection objects which are set between the first inspection part and the second inspection part, the first current supplied until the predetermined potential difference is reached between the inspection objects is controlled to be greater than the second current supplied after the predetermined potential difference is reached between the inspection objects. While the current is supplied so that the predetermined potential difference is reached between the inspection objects, the potential difference is supplied by the first current which is greater than the second current. It is thus possible to reduce a charging time. On the other hand, the second current which is less than the first current is supplied after the predetermined potential difference is reached between the inspection objects. It is thus possible to perform the spark detection with a reduced influence of the supply current.

According to the embodiment described in example 2, the first current and the second current are set in the range of 0 to 30 mA. It is thus possible to preferably perform the insulation inspection.

According to the embodiment described in example 3, the first current is controlled to be 5 to 30 times the second current. It is thus possible to reduce the time to apply the predetermined potential difference between the inspection objects, and to provide a high spark detection capability between the inspection objects between which the potential difference is applied.

BRIEF DESCRIPTION OF DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawings that show, by way of illustration, specific details and aspects of this disclosure in which the invention may be practiced.

The present disclosure relates to an insulation inspection apparatus configured to detect the occurrence of the spark failure in the case of the insulation inspection of the plurality of wiring patterns formed on the circuit board, efficiently and without increasing an inspection time, and a method thereof.

Figure 1:
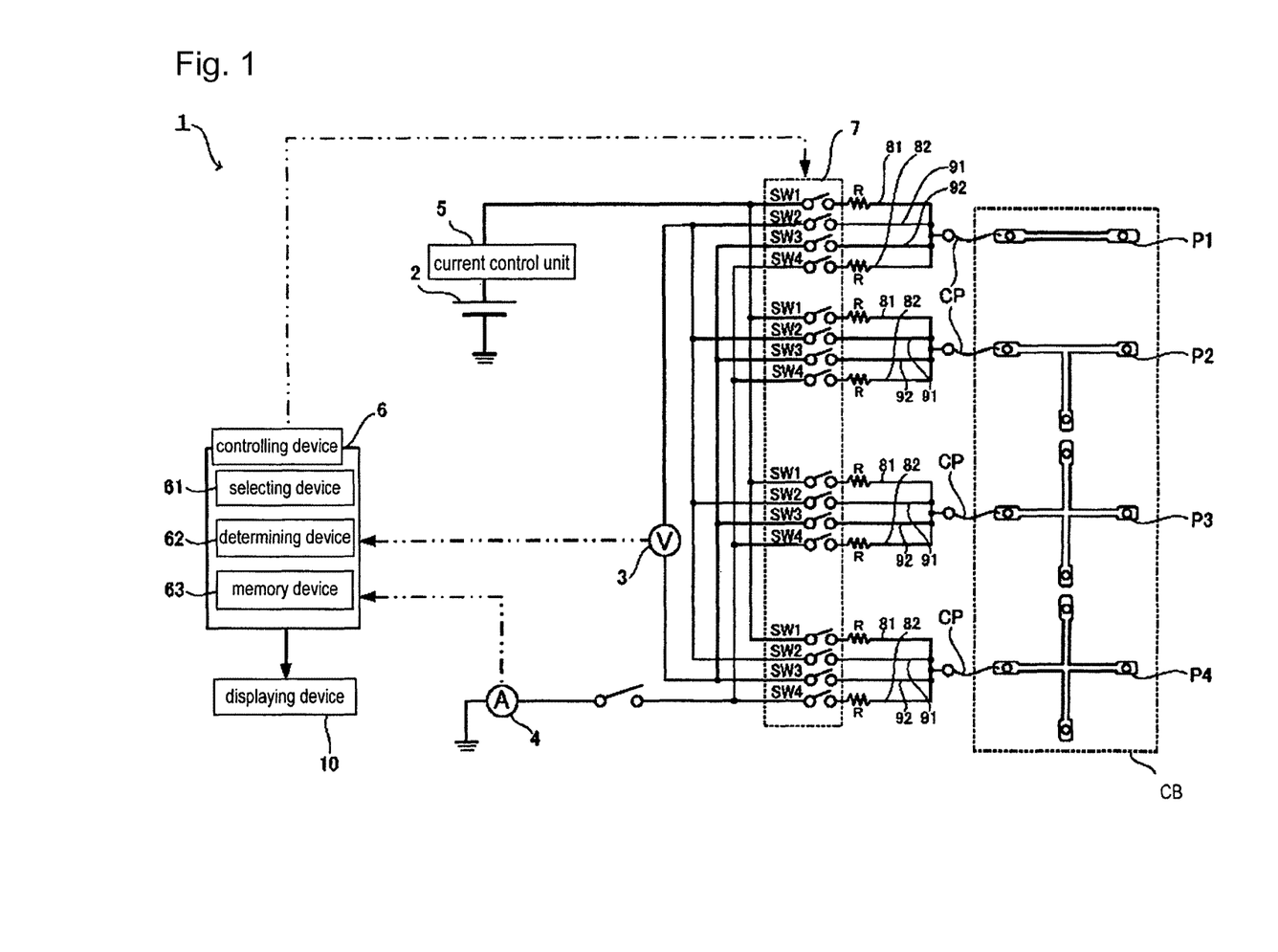
FIG. 1 is a schematic configuration diagram illustrating one embodiment of the insulation inspection apparatus of the present disclosure.

FIG. 1 is a schematic configuration diagram illustrating one embodiment of the insulation inspection apparatus of the present disclosure.

An insulation inspection apparatus 1 in the embodiment of the present disclosure is provided with a power supply device 2, a voltage detecting device 3, a current detecting device 4, a current control unit 5, a controlling device 6, a changing device 7, current supply terminals 8, voltage detection terminals 9, and a displaying device 10. In the embodiment illustrated in FIG. 1, there are illustrated the insulation inspection apparatus 1 of the present disclosure, a circuit board CB of inspection interest, and contact probes CP configured to electrically connect the insulation inspection apparatus 1 and the circuit board CB.

The circuit board CB illustrated in FIG. 1 has four wiring patterns P1 to P4. The number and shape of the wiring patterns on the circuit board CB are appropriately set depending on the circuit board CB designed. In the circuit board CB in FIG. 1, the line-shape wiring pattern P1, the T-shape wiring pattern P2, and the cross-shape wiring patterns P3 and P4 are illustrated, but the wiring patterns are not particularly limited to this example.

In FIG. 1, four contact probes CP in electrical contact with the respective wiring patterns P1 to P4 are illustrated. The contact probes CP connect the insulation inspection apparatus 1 and the circuit board CB in an electrically conductible manner. Moreover, the arrangement position and the number of the contact probes CP are appropriately set depending on the wiring patterns formed on the circuit board CB.

In the embodiment in FIG. 1, one contact probe CP is used to bring upstream-side and downstream-side current supply terminals and upstream-side and downstream-side voltage detection terminals described later in contact with a predetermined inspection position on the wiring pattern in the conductible manner; however, two separate contact probes CP may be also used to bring the current supply terminals 8 and the voltage detection terminals 9 in contact with the predetermined inspection position in the conductible manner.

The power supply device 2 applies a predetermined potential difference (or inspection voltage) for performing the insulation inspection, between a wiring pattern and another wiring pattern(s) as the inspection objects (hereinafter, between the inspection objects). The power supply device 2 may use, but not particularly limited to, a direct current power supply and an alternating current power supply. Any type can be used as long as it can apply the predetermined potential difference between the inspection objects.

The potential difference to be applied by the power supply device 2 is appropriately set by a user. In the case of the insulation inspection of the circuit board, the potential difference is set generally to 200 to 250 V.

The current control unit 5 controls a current supplied from the power supply device 2 and supplies it between the inspection objects. The current control unit 5 can control the amount of current or amperage to be increased or reduced, and the amount of current is controlled according to a control signal from the controlling device 6 described later. In the current control performed by the current control unit 5, specifically, a predetermined limit is set to the current supplied from the power supply device 2 in order to prevent a certain amount or more of current from flowing. Moreover, the current control unit 5 has at least two current limits as described above, and can limit the amount of current according to the control single from the controlling device 6 described later.

The current control unit 5 has a function of controlling as a first current the current supplied from the power supply device 2 while the inspection voltage is applied between the inspection objects (or before the predetermined potential difference is reached between the inspection objects), and a function of controlling as a second current the current supplied from the power supply device 2 after the predetermined inspection voltage is applied between the inspection objects (after the predetermined potential difference is reached between the inspection objects).

The current control unit 5 is configured such that the first current is greater than the second current. Thus, until the predetermined potential difference is reached between the inspection objects, the current supplied from the power supply device 2 is supplied under the limitation to the magnitude of the first current. Moreover, after the potential difference between the inspection objects is set to the predetermined potential difference, the current supplied from the power supply device 2 is supplied under the limitation to the magnitude of the second current. Therefore, when the predetermined potential difference is not reached between the inspection objects, the high-amperage first current is supplied, which enables the predetermined potential difference to be more quickly set between the inspection objects. After the predetermined potential difference is reached between the inspection objects, the low-amperage second current is supplied between the inspection objects, which reduces an influence of the current from the power supply device 2 and enables the spark detection. It is thus possible to perform accurate spark detection.

The first current and the second current controlled by the current control unit 5 are controlled preferably to be in a range of 0 to 30 mA. The insulation in an inspection object portion of the wiring patterns on the circuit board can be preferably inspected by controlling the current in the above current value range The current control unit 5 is configured to control the first current to be 5 to 30 times the second current. The control as described above enables the inspection objects to be processed, more quickly, when the predetermined potential difference is not reached between the inspection objects. The control as described above also enables the spark detection to be performed with a reduced influence of the current from the power supply device 2 after the predetermined potential difference is reached between the inspection objects. The control as described above is the best condition that the both effects are shown. Specifically, the first current is preferably set to 15 to 20 mA, and the second current is preferably set to 0 to 5 mA.

A specific condition to provide the first current and the second current which are more preferable is to set the first current to 20 mA and to set the second current to 1 mA. The setting as described above can reduce a current supply time until the predetermined potential difference is reached, and can improve the accuracy of the spark detection after the predetermined potential difference is reached. Incidentally, the present inventor has created the condition for more accurately detecting the spark failure upon insulation inspection in the wiring patterns on the circuit board by adjusting the first current and the second current, and the condition for improving the tact of the inspection of the circuit board massively processed.

The current control unit 5 has the function of adjusting a particular amount of current or amperage as described above, and can adopt, for example, a current limiter circuit. The use of the current limiter circuit allows the control of a predetermined amount of current. The current limiter circuit can perform the two types of current control as described above, and can change a control state between the first current and the second current according to the control signal of the controlling device 6 described later.

The voltage detecting device 3 detects a voltage between the inspection objects. As the voltage detecting device 3, there can be used, but not limited to, for example, a voltmeter, and any device that can detect the voltage between the inspection objects. By using a voltage value detected by the voltage detecting device 3 and a current value supplied from the power supply device 2, it is possible to calculate a resistance value between the inspection objects. Moreover, the use of the resistance value allows the inspection of insulation between the inspection objects. Incidentally, it can be also set such that the operation of the power supply device 2 is controlled by using the voltage value detected by the voltage detecting device 3.

The current detecting device 4 detects a current between the inspection objects. As the current detecting device 4, there can be used, but not limited to, for example, an ammeter, and any device that can detect the value of the current flowing between the inspection objects.

Although the current value supplied from the current supplying device (the power supply device) 2 can be determined, the current value between the inspection objects can be also detected by using the current detecting device 4.

The current supply terminals 8 are connected to the respective wiring patterns P via the contact probes CP in order to supply the current between the inspection objects. The current supply terminal 8 has an upstream-side current supply terminal 81 configured to connect the wiring pattern P and the upstream side (or positive electrode side) of the current supplying device 2, and a downstream-side current supply terminal 82 configured to connect the wiring pattern 2 and the downstream side (or negative electrode side) of the current supplying device 2 or the current detecting device 4. As illustrated in FIG. 1, the upstream-side current supply terminal 81 and the downstream-side current supply terminal 82 of the current supply terminal 8 are provided for each of the wiring patterns P.

Each of the upstream-side current supply terminal 81 and the downstream-side current supply terminal 82 has a switch element SW of the changing device 7. Due to the ON/OFF operation of the switch element SW of the changing device 7, a connected state/disconnected state is set. The current supply terminal 8 is preferably provided with a resistance for electrostatic discharge protection.

The voltage detection terminals 9 are connected to the respective wiring patterns P via the contact probes CP in order to supply the voltage between the inspection objects. The voltage detection terminal 9 has an upstream-side voltage detection terminal 91 configured to connect the wiring pattern P and the upstream side (or positive electrode side) of the voltage detecting device 3, and a downstream-side voltage detection terminal 92 configured to connect the wiring pattern 2 and the downstream side (or negative electrode side) of the voltage detecting device 3. As illustrated in FIG. 1, the upstream-side voltage detection terminal 91 and the downstream-side voltage detection terminal 92 of the voltage detection terminal 9 are provided for each of the wiring patterns P. Each of the upstream-side voltage detection terminal 91 and the downstream-side voltage detection terminal 92 is connected to a switch element SW of the changing device 7, as in the current supply terminal 8. Due to the ON/OFF operation of the switch element SW of the changing device 7, the connected state/disconnected state is set.

The current supply terminal 8 and the voltage detection terminal 9 are provided with four terminals for one contact probe CP in contacting conduct with the wiring pattern P, and four switch elements SW configured to perform the ON/OFF control of the respective terminals, as illustrated in FIG. 1. Incidentally, FIG. 1 illustrates the switch element configured to control the operation of the upstream-side current supply terminal 81 as a numerical reference SW1, the switch element configured to control the operation of the upstream-side voltage detection terminal 91 as a numerical reference SW2, the switch element configured to control the operation of the downstream-side voltage detection terminal 92 as a numerical reference SW3, and the switch element configured to control the operation of the downstream-side current supply terminal 82 as a numerical reference SW4.

The changing device 7 is provided with the plurality of switch elements SW in conducting contact with the respective contact probes CP described above. In the changing device 7, the ON/OFF operation is controlled by an actuating signal from the controlling device 6 described later.

The controlling device 6 performs overall control of the apparatus 1, such as selecting the wiring patterns P as the inspection objects, detecting the spark on the basis of the voltage value from the voltage detecting device 3, and transmitting an operating instruction signal of the changing device 7. The controlling device 6 is provided with a selecting device 61, a determining device 62, and a memory device 63, as illustrated in FIG. 1.

The selecting device 61 selects and specifies the wiring pattern P as the inspection object from the plurality of patterns P on the circuit board CB. The selecting device 61 specifies the wiring pattern P as the inspection object, thereby the wiring patterns P on which the insulation inspection is to be performed are selected in order. As a method of selecting the wiring patterns P as the inspection objects performed by the selecting device 61, there is exemplified a method in which the order of the wiring patterns P as the inspection objects is set in the memory device 63 in advance and in which the wiring patterns P as the inspection objects are selected in this order. The selection method can adopt, but not limited to, the method as described above and any method that can select the wiring patterns P as the inspection objects in good order.

The specific selection of the wiring patterns P performed by the selecting device 61 is performed by using the changing device 7. For example, the ON/OFF control of each switch element SW of the changing device 7 allows the selection of the wiring pattern P as the inspection object. In the insulation inspection apparatus in the embodiment, the switch element SW is turned ON to connect the wiring pattern P as the inspection object with the upstream-side current supply terminal 81 for being connected to the power supply device 2. At the same time, the switch element SW is turned ON to connect the wiring pattern P with the upstream-side voltage detection terminal 91.

For example, in the embodiment illustrated in FIG. 1, if the wiring pattern P1 is the inspection object, the selecting device 61 selects the upstream-side current supply terminal 81 and the upstream-side voltage detection terminal 91 for being connected to the wiring pattern P1 and transmits a signal for turning ON the switch element SW1 and the switch element SW2 of the respective terminals 81 and 91. By the reception of the signal by the changing device 7, the switch element SW1 and the switch element SW2 are operated. In this case, a signal for turning ON the switch SW3 and the switch SW4 corresponding to the wiring patterns other than the wiring pattern as the inspection object (or the remaining wiring patterns) is also transmitted.

As explained above, the wiring patterns P as the inspection objects is selected from the plurality of wiring patterns on the circuit board CB by the selecting device 61. As the wiring pattern(s) P selected by the selecting device 61 of the insulation inspection apparatus 1 illustrated in the embodiment, one wiring pattern P is selected from the plurality of wiring patterns formed on the circuit board CB. In other words, the insulation inspection is performed between the one wiring pattern P selected by the selecting device 61 and all the remaining wiring patterns P. The inspection objects are set by selecting the wiring pattern P in this manner.

The determining device 62 determines the occurrence of the spark on the basis of the voltage value from the voltage detecting device 3. In the determination performed by the determining device 62, for example, the voltage between the inspection objects caused by the voltage application is detected, and if a voltage drop is detected, it can be determined as the spark failure. Although this is not illustrated in FIG. 1, a voltage change due to the spark failure can be also detected by detecting a voltage change between the upstream-side current supply terminal 81 and the upstream-side voltage detection terminal 91. Incidentally, in a determination method performed by the determining device 62, it may be considered to be defective in the case of the detection of the voltage drop between the inspection objects as described above, or the voltage change between the upstream-side current supply terminal and the upstream-side voltage detection terminal of the wiring patterns P which form the inspection objects may be used (not illustrated).

The displaying device 10 displays a state of the insulation inspection. The displaying device 10 displays the detection of the spark. The content displayed by the displaying device 10 is not particularly limited, and is appropriately set by a maker of the insulation inspection apparatus.

The above is the explanation of the configuration of the insulation inspection apparatus 1 of the present disclosure.

Next, the operation of the insulation inspection apparatus will be explained.

Figure 2:
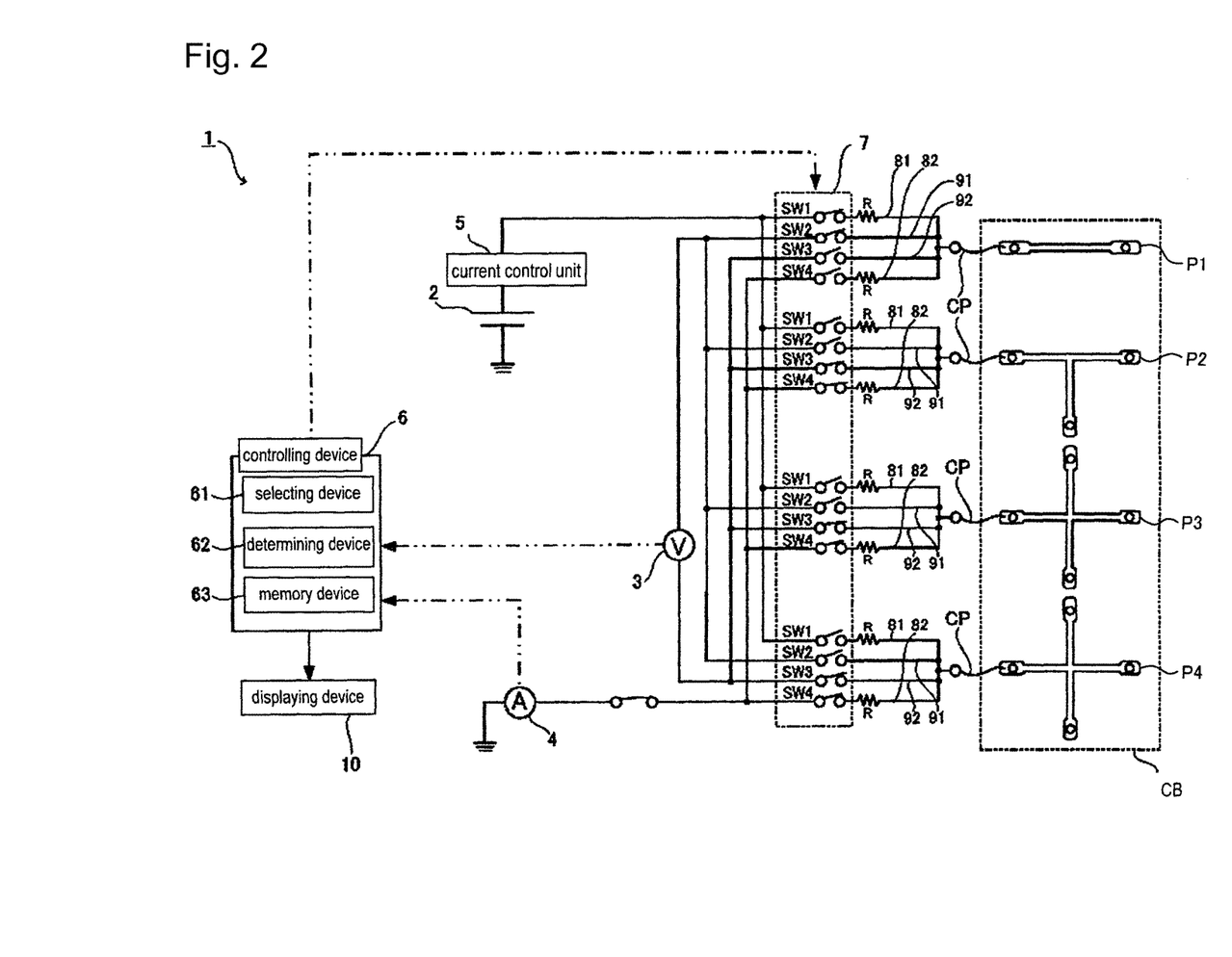
FIG. 2 is a diagram illustrating one embodiment of the operation of the insulation inspection apparatus of the present disclosure.
Figure 3A:
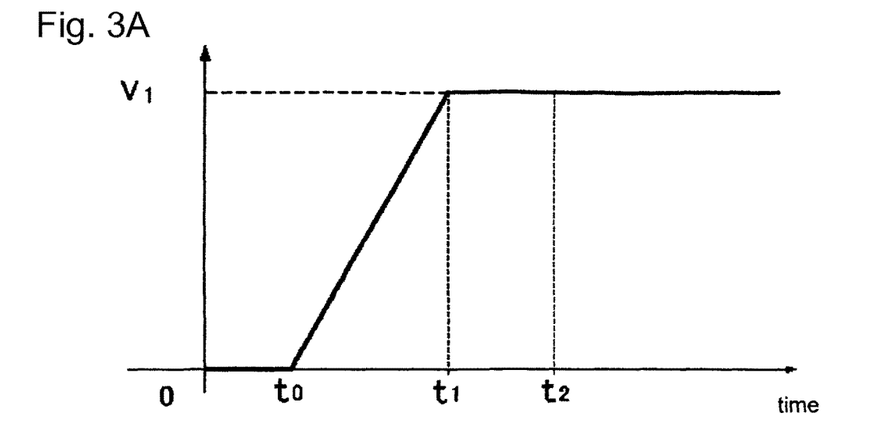
FIGS. 3A and 3B are graphs illustrating a voltage change between inspection objects in the present disclosure.
Figure 3B:
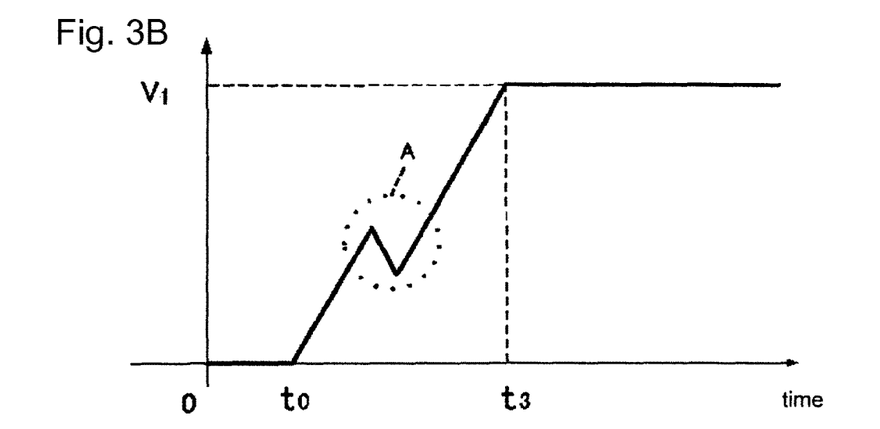

Incidentally, FIG. 2 is a diagram illustrating one embodiment of the operation of the insulation inspection apparatus of the present disclosure. FIGS. 3A and 3B are graphs illustrating the voltage change of the insulation inspection apparatus; FIG. 3A illustrates the voltage change in the case of a non-defective product and FIG. 3B illustrates the voltage change in the case of a defective product.

Firstly, information about the wiring patterns P of the circuit board CB as the inspection objects or the like is stored in the memory device 63, and a preparation for the conduction and insulation inspection of the circuit board CB is made. Then, the circuit board CB is disposed at a predetermined inspection position. The contact probes CP are disposed at inspection points on the wiring patterns P formed on the circuit board CB, and the contact probes CP abut on the wiring patterns P in an electrically connectable manner.

After the circuit board CB is prepared, the conduction inspection is performed. In this case, although the details are not described, the conduction inspection is performed on all the wiring patterns, and if there is no problem in the conduction state of all the wiring patterns (or if all the wiring patterns pass the conduction inspection), the insulation inspection is then performed.

In this case, the selecting device 61 selects the wiring pattern P as the inspection object in order to set the inspection objects. If the selecting device 61 selects the wiring pattern P as the inspection object, the selecting device 61 specifies the upstream-side current supply terminals 81 and the upstream voltage detection terminals 91 of the wiring pattern P which is selected as the inspection object. Then, the actuating signal is transmitted from the selecting device 61 to the changing device 7 to turn on the switch elements SW1 and SW2 for setting the specified upstream-side current supply terminal 81 and the specified upstream voltage detection terminal 91 to be in the connected state. When receiving the signal regarding the ON/OFF operation of the switch elements from the selecting device 61, the changing device 7 performs the ON/OFF control of the switch elements SW according to the signal.

More specifically, for example, if the wiring pattern P1 is the wiring pattern as the inspection object, the switch elements SW1 and SW2 respectively connected to the upstream-side current supply terminal 81 and the upstream voltage detection terminal 91 corresponding to the wiring pattern P1 are turned ON. At the same time, in order to set the contact probes CP which are in contact with the wiring pattern P2 to the wiring pattern P4 other than the wiring pattern P1 to be connected to the respective downstream-side current supply terminals 82, the control is performed to turn ON the switch elements SW3 of the respective downstream-side voltage detection terminals 92 and the switch elements SW4 of the respective downstream-side current supply terminals 82 (refer to FIG. 2).

In an operating state illustrated in FIG. 2, as explained above, the wiring pattern P1 is selected as the inspection object. Thus, the wiring pattern P1 is connected to the upstream-side current supply terminal 81 and the upstream-side voltage detection terminal 91 with the switch element SW1 and the switch element SW2 turned ON. At this time, the wiring pattern P2 to the wiring pattern P4 other than the inspection object are connected to the respective downstream-side current supply terminals 82 and the downstream-side voltage detection terminals 92 with the respective switch elements SW3 and the respective switch elements SW4 turned ON.

If the switch elements SW are ON or OFF-controlled as described above, the inspection objects are set, and the predetermined potential difference for the insulation inspection is applied to the wiring pattern P1. Specifically, the controlling device 6 transmits a signal to the power supply device 2 to supply electric power, and transmits a signal to the current control unit 5 to perform the limitation to the first current. If the controlling device 6 transmits the control signal to the power supply device 2 and the current control unit 5, the current limited to the first current is supplied from the power supply device 2 to the current control unit 5. The first current is set to be greater than the second current, and it is thus possible to quickly set the potential difference between the inspection objects to be the predetermined potential difference.

In this case, the voltage detecting device 3 detects the voltage between the inspection objects during the insulation inspection, and transmits a detection result to the controlling device 6. The controlling device 6 transmits the signals for controlling the power supply device 2 and the current control unit 5 on the basis of information about the voltage detected by the voltage detecting device 3.

FIG. 3A is a graph illustrating the voltage change if there is no spark failure, and FIG. 3B is a graph illustrating the voltage change if there is the spark failure. In FIGS. 3A and 3B, a voltage value V1 is set to the predetermined potential difference applied between the inspection objects. It is illustrated that the voltage between the inspection objects increases to the predetermined potential difference between a time point t0 and a time point t1 in FIG. 3A and between the time point t0 to a time point t3 in FIG. 3B, and the first current is supplied during those periods.

If the voltage between the inspection objects is set to the predetermined potential for the insulation inspection by the supply of the current (or the first current) from the power supply device 2, the controlling device 6 receives a signal from the voltage detecting device 3 and confirms the supply of the predetermined voltage between the inspection objects. The controlling device 6 then transmits the control signal to the current control unit 5 to limit the current from the power supply device 2 to the second current. If receiving the control signal from the controlling device 6, the current control unit 5 limits the current from the power supply device 2 to the second current.

If receiving the control signal from the controlling device 6, the current control unit 5 limits the current from the power supply device 2 to the second current and supplies it. The second current is set to be less than the first current and is supplied between the inspection objects between which the predetermined voltage has been already reached. The second current is thus supplied with an extremely reduced influence on the spark failure. Therefore, the insulation inspection can be performed, with improved accuracy of the detection of the spark failure.

In FIG. 3A, the current supply using the second current is performed between the time point t1 and a time point t2. In FIG. 3B, a time point at which the insulation inspection is performed is not illustrated in the graph because the spark failure (or a portion illustrated in a numerical reference A in the drawing) is detected between the time point t0 and the time point t3. After the time point t3, the second current is supplied between the inspection objects.

In the controlling device 6, the predetermined potential difference starts to be applied between the inspection objects as described above, and the voltage between the inspection objects is continuously detected until a predetermined time after the setting of the predetermined potential difference between the inspection objects. At this time, for example, as in FIG. 3A, if the voltage drop caused by the spark is not calculated, the insulation inspection is performed without any spark failure between the inspection objects. Incidentally, in FIG. 3A, the voltage value between the inspection objects at the time point t2 is detected to calculate the resistance value between the inspection objects. The time point t2 is set to be a predetermined time after the predetermined potential difference is reached between the inspection objects.

Moreover, as in FIG. 3B, if the voltage drop caused by the spark is calculated, for example, if the voltage drop during the supply of the first current or the voltage drop during the supply of the second current is detected, then, the determining device 62 determines that there is the spark failure between the inspection objects.

If the spark occurs as described above, the user is notified of the occurrence of the spark, and the magnitude of the spark is calculated. The spark is displayed with the magnitude at the same time. Therefore, the user can easily detect the spark which occurs during the insulation inspection and also know the magnitude of the spark.

In the insulation inspection apparatus 1, the insulation inspection of one wiring pattern P as the inspection object and all the remaining wiring patterns is performed. After the insulation inspection of the one wiring pattern P as the inspection object is ended, a next wiring pattern P is selected as the inspection object, and the insulation inspection of the next wiring pattern P and all the remaining wiring patterns is performed, which is repeated. If the insulation inspection of each inspection object (or the wiring pattern P as the inspection object) is performed, the spark failure as described above is also inspected at the same time. If the failure is detected, it is determined to be a defective circuit board, and the inspection is ended.

As described above, the insulation inspection is performed with all the wiring patterns on the inspected circuit board as the wiring pattern which is the inspection object.

The invention claimed is:

1. An insulation inspection method for an insulation inspection apparatus of performing insulation inspection of a wiring pattern as an inspection object which is selected from a plurality of wiring patterns formed on a circuit board, said insulation inspection method comprising:
    selecting as a first inspection part the wiring pattern as the inspection object from the plurality of wiring patterns and of selecting as a second inspection part a wiring pattern as an inspection object other than the first inspection part;
    supplying electric power via a power supply device electrically connected to each of the first inspection part and the second inspection part, such that a predetermined potential difference for the insulation inspection is developed between the inspection objects;
    detecting a potential difference via a voltage detecting device between the inspection objects when the electric power is supplied between the inspection objects;
    determining an insulation state between the inspection objects on the basis of the detected potential difference; and
    controlling a first predetermined current limit to be greater than a second predetermined current limit, via a current control unit configured to control a current from the power supply device, wherein the first predetermined current limit is applied until the potential difference is reached and wherein the second predetermined current limit is greater than zero and is applied after the potential difference is reached between the inspection objects.

2. The insulation inspection method of claim 1, wherein said until the potential difference is reached, takes place prior to elapsing of a first time (t1).

3. The insulation inspection method of claim 2, wherein said developing the predetermined potential difference according to the second current limit is performed for a predetermined time beginning at the first time (t1) for a duration until a second time (t2).

4. The insulation inspection method of claim 2 wherein said determining an insulation state further comprises calculating a resistance across the first inspection part and the second inspection part during the predetermined time.

5. The inspection method of claim 4, further comprising detecting a voltage drop prior to the elapsing of the first time (t1), said voltage drop indicating an occurrence of a spark across the first inspection part and the second inspection part.

6. The inspection method of claim 5, further comprising discontinuing the insulation inspection upon detection of said spark.

7. The inspection method of claim 5, further comprising:
    calculating a magnitude of said spark based on the voltage drop; and
    displaying the magnitude of the spark on a display.

8. The inspection method of claim 2, wherein the first current limit is selected such that a duration of time prior to the elapsing of the first time (t1) is shorter than a corresponding duration at the second current limit.

9. An insulation inspection apparatus configured to perform insulation inspection of a wiring pattern as an inspection object which is selected from a plurality of wiring patterns formed on a circuit board,
    said insulation inspection apparatus comprising:
    a selecting device configured to select as a first inspection part the wiring pattern as the inspection object from the plurality of wiring patterns and to select as a second inspection part a wiring pattern as an inspection object other than the first inspection part;
    a power supply device electrically connected to each of the first inspection part and the second inspection part and to supply electric power, in order to set a predetermined potential difference between the first inspection part and the second inspection part;
    a voltage detecting device configured to detect a potential difference between the first inspection part and the second inspection part; and
    a determining device configured to determine the circuit board to be a non-defective product or a defective product based on the detected potential difference, wherein
    the power supply device comprises a current control unit configured to control a current from the power supply device, and
    the current control unit controls a first current limit, the first current limit predetermined to be greater than a second current limit, the second current limit predetermined to be greater than zero, the first current limit being applied until the potential difference between the first inspection part and the second inspection part reaches the predetermined potential difference, the second current limit being applied when the detected potential difference reaches the predetermined potential difference.

10. The insulation inspection apparatus according to claim 9, wherein the current control unit controls the first current limit and the second current limit to be in a range not exceeding 30 mA.

11. The insulation inspection apparatus according to claim 10, wherein the current control unit controls the first current limit to be 5 to 30 times the second current limit.

12. The insulation inspection apparatus according to claim 9, wherein the current control unit controls the first current limit to be 5 to 30 times the second current limit.

13. The insulation inspection apparatus according to claim 9, wherein the selecting device is configured to select the wiring patterns, respectively, as the first inspection part and the second inspection part according to a predetermined order.

14. The insulation inspection apparatus according to claim 13, further comprising a memory for storing the predetermined order.

15. The insulation inspection apparatus according to claim 9, wherein the first current limit is in a range of currents selected to charge the first inspection part and the second inspection part to the predetermined potential difference prior to elapsing of a first time (t1) where the first time (t1) occurs before a second time (tx) required to charge the first inspection part and the second inspection part to the predetermined potential difference according to the second current limit.

* * * * *